United States Patent
Buckland

(10) Patent No.: US 11,890,644 B2
(45) Date of Patent: Feb. 6, 2024

(54) ULTRASONIC DEVICES INCLUDING ACOUSTICALLY MATCHED REGIONS THEREIN

(71) Applicant: Sensus Spectrum, LLC, Morrisville, NC (US)

(72) Inventor: Justin Rorke Buckland, Cambridge (GB)

(73) Assignee: Sensus Spectrum, LLC, Morrisville, NC (US)

( * ) Notice: Subject to any disclaimer, the term of this patent is extended or adjusted under 35 U.S.C. 154(b) by 495 days.

(21) Appl. No.: 17/104,371

(22) Filed: Nov. 25, 2020

(65) Prior Publication Data
US 2021/0078041 A1 Mar. 18, 2021

Related U.S. Application Data

(62) Division of application No. 15/889,479, filed on Feb. 6, 2018, now Pat. No. 10,850,308.

(Continued)

(51) Int. Cl.
*B06B 1/06* (2006.01)
*G01N 29/28* (2006.01)
(Continued)

(52) U.S. Cl.
CPC ........... *B06B 1/067* (2013.01); *G01N 29/245* (2013.01); *G01N 29/28* (2013.01); *G10K 11/02* (2013.01);
(Continued)

(58) Field of Classification Search
CPC .. B06B 1/067; H10N 30/883; H10N 30/8554; G01N 29/245; G01N 29/28; G10K 11/02
See application file for complete search history.

(56) References Cited

U.S. PATENT DOCUMENTS

| 4,366,406 A | 12/1982 | Smith et al. |
| 4,523,122 A | 6/1985 | Tone et al. |

(Continued)

FOREIGN PATENT DOCUMENTS

JP 2016192666 A * 11/2016

OTHER PUBLICATIONS

Notification Concerning Transmittal of International Preliminary Report on Patentability, PCT/US2018/016996, dated Sep. 6, 2019, 13 pages.

(Continued)

*Primary Examiner* — J. San Martin
(74) *Attorney, Agent, or Firm* — Stanek Lemon Crouse & Meeks, P.A.

(57) ABSTRACT

Ultrasonic devices include a transducer having a piezoelectric element therein that may operate as an acoustic signal receiving surface and/or an acoustic signal generating surface. At least one acoustic matching layer is provided on the piezoelectric element. This at least one acoustic matching layer may be configured as a composite of N acoustic matching layers, with a first of the N acoustic matching layers contacting the primary surface of the piezoelectric element. This first acoustic matching layer may have an acoustic impedance equivalent to $Z_{L1}$, where N is a positive integer greater than zero. In some embodiments of the invention, the magnitude of $Z_{L1}$ may be defined as: $0.75 ((Z_p)^{N+1}(Z_g))^{1/(N+2)} \leq Z_{L1} \leq 1.25 ((Z_p)^{N+1}(Z_g))^{1/(N+2)}$, where $Z_p$ is the acoustic impedance of the piezoelectric element (e.g., lead zirconate titanate (PZT)) and $Z_g$ is the acoustic impedance of a compatible gas.

18 Claims, 2 Drawing Sheets

Related U.S. Application Data

(60) Provisional application No. 62/463,375, filed on Feb. 24, 2017.

(51) Int. Cl.
*G01N 29/24* (2006.01)
*G10K 11/02* (2006.01)
*H10N 30/88* (2023.01)
*H10N 30/853* (2023.01)

(52) U.S. Cl.
CPC ....... *H10N 30/8554* (2023.02); *H10N 30/883* (2023.02)

(56) References Cited

U.S. PATENT DOCUMENTS

| | | | |
|---|---|---|---|
| 5,418,759 A | 5/1995 | Fiebiger et al. | |
| 6,989,625 B2 | 1/2006 | Suzuki et al. | |
| 9,804,126 B2 | 10/2017 | Logue | G01N 29/28 |
| 2003/0032884 A1 | 2/2003 | Smith et al. | |
| 2003/0177813 A1 | 9/2003 | Sakamoto | G01N 29/032 |
| | | | 73/24.01 |
| 2004/0113522 A1 | 6/2004 | Nagahara | G10K 11/02 |
| | | | 310/326 |
| 2004/0124746 A1 | 7/2004 | Suzuki | G01F 1/662 |
| | | | 310/326 |
| 2004/0174772 A1 | 9/2004 | Jones | G10K 11/02 |
| | | | 367/152 |
| 2004/0200056 A1 | 10/2004 | Suzuki et al. | |
| 2005/0139013 A1 | 6/2005 | Hashimoto | G10K 11/02 |
| | | | 73/861.27 |
| 2005/0184620 A1 | 8/2005 | Choi et al. | |
| 2005/0236932 A1 | 10/2005 | Nagahara | G01F 1/667 |
| | | | 310/328 |
| 2006/0071580 A1* | 4/2006 | Sawada | B06B 1/067 |
| | | | 310/369 |
| 2010/0168581 A1 | 7/2010 | Knowles et al. | |
| 2014/0102204 A1* | 4/2014 | Akiyama | G01H 9/00 |
| | | | 156/60 |
| 2015/0241393 A1 | 8/2015 | Ganti et al. | |
| 2018/0242066 A1 | 8/2018 | Buckland | H01L 41/313 |
| 2019/0025102 A1 | 1/2019 | Sugaya | B06B 1/067 |
| 2019/0342654 A1 | 11/2019 | Buckland | B06B 1/067 |
| 2020/0253582 A1* | 8/2020 | Nakai | A61B 8/4444 |

OTHER PUBLICATIONS

Notification of Transmittal of the International Search Report and the Written Opinion of the International Searching Authority, PCT/US2018/016996, dated Jul. 6, 2018, 20 pages.

Invitation to Pay Additional Fees and, Where Applicable, Protest Fee, PCT/US2018/016996, dated May 9, 2018, 6 pages.

Alvarez-Arenas et al., *Novel Impedance Matching Materials and Strategies for Air-Coupled Piezoelectric Transducers*; IEEE Sensors, Nov. 3-6, 2013, 4 pages.

Alvarez-Arenas et al., *Novel Impedance Matching Materials and Strategies for Air-Coupled Piezoelectric Transducers*; Research Gate; Conference Paper; Nov. 2013; 5 pages.

Alvarez-Arenas; *A Nondestructive Integrity Test for Membrane Filters Based on Air-Coupled Ultrasonic Spectroscopy*; IEEE Transactions on Ultrasonics, Ferroelectrics, and Frequency Control; vol. 50, No. 6; Jun. 2003; pp. 675-685.

Alvarez-Arenas; *Acoustic Impedance Matching of Piezoelectric Transducers to the Air*; IEEE Transactions on Ultrasonics, Ferroelectrics, and Frequency Control; vol. 51, No. 5; May 2004; pp. 624-633.

Saffar, S. et al; *Determination of Acoustic Impedances of Multi Matching Layers for Narrowband Ultrasonic Airborne Transducers at Frequencies*; Ultrasonics; Jan. 2012; 2 pages.

* cited by examiner

ULTRASONIC DEVICES INCLUDING ACOUSTICALLY MATCHED REGIONS THEREIN

CLAIM FOR PRIORITY

The present application is a divisional of U.S. patent application Ser. No. 15/889,479 entitled Ultrasonic Devices Including Acoustically Matched Regions Thereon; filed in the United States Patent & Trademark Office on Feb. 6, 2018 and claims priority to U.S. Patent Application Ser. No. 62/463,375, entitled Ultrasonic Gas Transducers Having Acoustically Matched Regions Therein, which was filed in the United States Patent and Trademark Office on Feb. 24, 2017, the disclosures of which are hereby incorporated herein by reference as if set forth in their entireties.

CROSS-REFERENCE TO RELATED APPLICATIONS

This non-provisional application is related to U.S. application Ser. No. 15/374,044, filed Dec. 9, 2016, entitled "Thickness Mode Transducers and Related Devices and Methods," U.S. application Ser. No. 15/374,129, filed Dec. 9, 2016, entitled "Thickness-Planar Mode Transducers and Related Devices," and to U.S. Provisional Patent Application Ser. No. 62/461,610, filed Feb. 22, 2017, entitled "Multi-Element Bending Transducers and Related Methods and Devices," the disclosures of each of which are hereby incorporated herein by reference as if set forth in their entireties.

FIELD

The present invention relates to transducer-based electrical devices and, more particularly, piezoelectric-based transducers.

BACKGROUND

Acoustic matching layers have been used to improve acoustic transmission efficiency between acoustic elements having relatively high acoustic impedance, such as lead zirconate titanate (PZT) elements within piezoelectric transducers, and mediums having relatively low acoustic impedance, such as gases. The acoustic impedance of a material is a function of material density and speed of sound therein. When acoustically matching a piezoelectric material such as PZT with a gas such as methane, a matching layer consisting of a solid material with a very low speed of sound and low density is typically preferred. For example, as disclosed in U.S. Pat. No. 4,523,122 to Tone et al., an acoustic impedance matching layer may include thermally-expanded resin-based microspheres dispersed in a cured product of thermosetting resin. In addition, U.S. Pat. No. 6,989,625 to Suzuki et al. discloses using a first acoustic matching layer having a low density and low sonic velocity, and a second acoustic matching layer having a higher density and higher sonic velocity, in an ultrasonic transducer. This first acoustic matching layer may be formed as a dry gel layer, which is disclosed as a porous body produced by a sol-gel process.

Still further examples of efforts to match the acoustic impedance of piezoelectric transducers to air using membrane filter materials are disclosed in articles by T. E. Gomez Alvarez-Arenas entitled "*Acoustic Impedance Matching of Piezoelectric Transducers to the Air,*" IEEE Trans. on Ultrasonics, Ferroelectrics, and Frequency Control, Vol. 51, No. 5, pp. 624-633, May (2004) and "*A Nondestructive Integrity Test for Membrane Filters Based on Air-Coupled Ultrasonic Spectroscopy,*" IEEE Trans. on Ultrasonics, Ferroelectrics, and Frequency Control, Vol. 50, No. 6, pp. 676-685, June (2003). Finally, the use of air-coupled piezoelectric transducers with matching layers based on rigid and machinable polymer foams having high sonic velocity and almost closed-pore structure are disclosed in an article by T. E. Gomez Alvarez-Arenas et al., entitled "*Novel Impedance Matching Materials and Strategies for Air-Coupled Piezoelectric Transducers,*" IEEE Sensors, Nov. 3-6 (2013).

SUMMARY

Ultrasonic devices according to embodiments of the invention include a transducer having a piezoelectric element therein that may operate as an acoustic signal receiving surface and/or an acoustic signal generating surface. In addition, at least one acoustic matching layer is provided on the piezoelectric element. This at least one acoustic matching layer may be configured as a composite of N acoustic matching layers, with a first of the N acoustic matching layers contacting the primary surface of the piezoelectric element. This first acoustic matching layer may have an acoustic impedance equivalent to $Z_{L1}$, where N is a positive integer greater than zero. In some embodiments of the invention, the magnitude of $Z_{L1}$ may be defined as: $0.75\ ((Z_p)^{N+1}(Z_g))^{1/(N+2)} \leq Z_{L1} \leq 1.25\ ((Z_p)^{N+1}(Z_g))^{1/(N+2)}$, where $Z_p$ is the acoustic impedance of the piezoelectric element (e.g., lead zirconate titanate (PZT)) and $Z_g$ is the acoustic impedance of a compatible gas.

A protective layer, which may be directly exposed to a compatible gas during operation of the device, is provided on the at least one acoustic matching layer. In particular, a protective layer may be provided, which has an acoustic impedance equivalent to $Z_{pl}$, where: $0.5\ ((Z_p)(Z_g)^{N+1})^{1/(N+2)} \leq Z_{pl} \leq 1.5\ ((Z_p)(Z_g)^{N+1})^{1/(N+2)}$. In some embodiments of the invention, the protective layer, which may be provided as a polyethylene terephthalate (PET) layer, may be metalized with aluminum (Al) and have a thickness of less than about 20 microns.

According to additional embodiments of the invention, the ultrasonic device may have two acoustic matching layers (i.e., N=2) and a second of the N acoustic matching layers may extend between the protective layer and the first of the N acoustic matching layers. This second acoustic matching layer may have an acoustic impedance equivalent to $Z_{L2}$, where $Z_{L2}$ is defined as: $0.75\ ((Z_p)^2(Z_g)^2)^{0.25} \leq Z_{L2} \leq 1.25\ ((Z_p)^2(Z_g)^2)^{0.25}$. The first acoustic matching layer may be formed as a polyethersulfone (PES) layer for when N=1 and the second acoustic matching layer may be formed as a PES layer for when N=2.

According to still further embodiments of the invention, an ultrasonic device may include a transducer having a piezoelectric element therein and a first acoustic matching layer (e.g., polyethersulfone (PES) layer) on the piezoelectric element. A polymer protective layer is provided on the first acoustic matching layer. This polymer protective layer may be configured as a polyethylene terephthalate (PET) layer having a thickness of less than about 20 microns. Preferably, a thickness is chosen so that the protective layer inhibits chemical and/or mechanical damage to an underlying acoustic matching layer, yet enables sufficient fine-tuning of an acoustic matching frequency. According to some of these embodiments of the invention, a second acoustic matching layer formed of PET may be provided, which extends between the first acoustic matching layer and the piezoelectric element. In particular, the second acoustic matching layer may be bonded to the piezoelectric element and the polymer protective layer may be bonded to the first acoustic matching layer. The polymer protective layer may also be metalized with aluminum in order to provide additional chemical/mechanical protection without significantly reducing frequency tuning capability.

DETAILED DESCRIPTION OF EMBODIMENTS

Figure 1A:
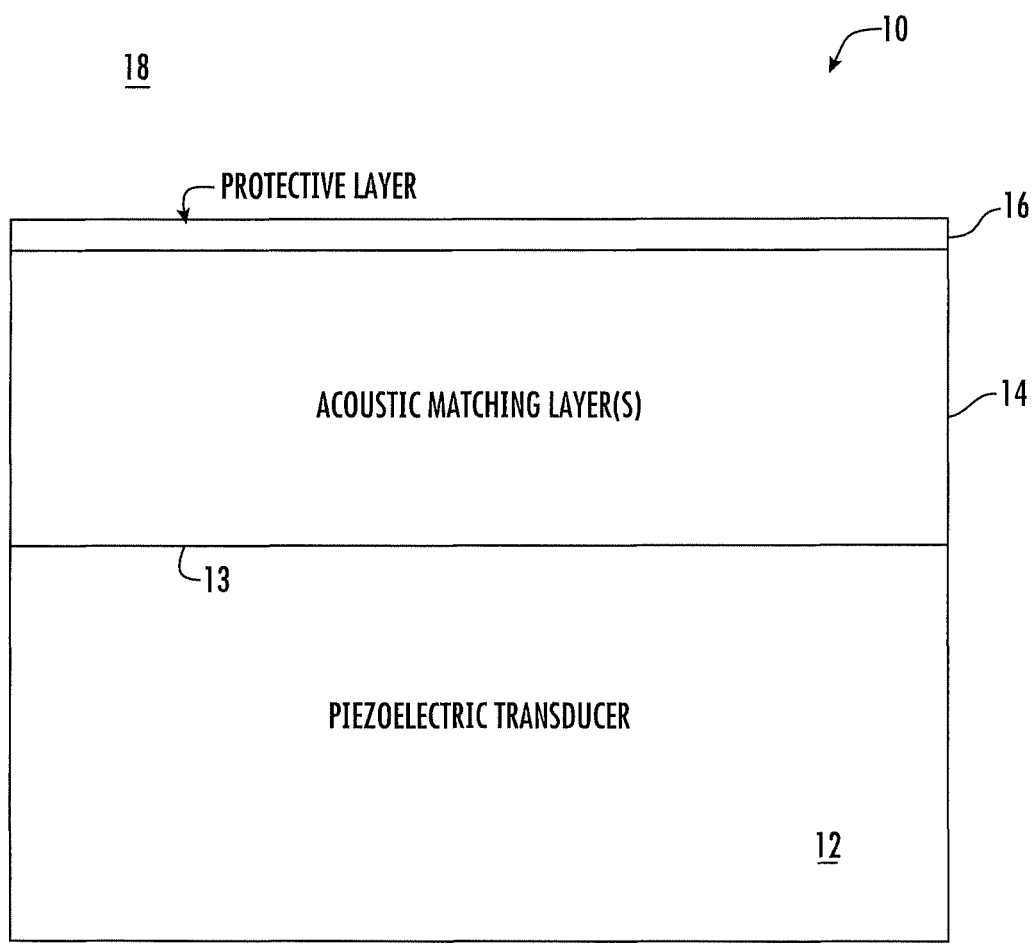
FIGS. 1A-1B are cross-sectional views of ultrasonic transducers according to embodiments of the invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Referring now to FIG. 1A, an ultrasonic device 10 according to an embodiment of the invention is illustrated as including an ultrasonic transducer 12 (e.g., thickness-mode transducer) having a piezoelectric element therein. As will be understood by those skilled in the art, because an ultrasonic transducer can convert acoustic signals (e.g., ultrasound waves) to electrical signals and/or vice versa, the piezoelectric element may operate as an acoustic signal generating/receiving surface 13. When the piezoelectric element is used as an acoustic signal receiving surface, the device 10 may operate as an ultrasonic sensor.

As shown by FIG. 1A, at least one acoustic matching layer 14 is provided on the piezoelectric element of the transducer 12. This at least one acoustic matching layer 14 may be configured as a composite of N acoustic matching layers (e.g., of different materials, densities, etc.), with a first of the N acoustic matching layers contacting the primary surface of the piezoelectric element within the transducer 12. This first acoustic matching layer may have an acoustic impedance equivalent to $Z_{L1}$, where N is a positive integer greater than zero. In some embodiments of the invention, the magnitude of $Z_{L1}$ may be defined as: $0.75 \; ((Z_p)^{N+1}(Z_g))^{1/(N+2)} \leq Z_{L1} \leq 1.25 \; ((Z_p)^{N+1}(Z_g))^{1/(N+2)}$, where $Z_p$ is the acoustic impedance of the piezoelectric element (e.g., lead zirconate titanate (PZT)) and $Z_g$ is the acoustic impedance of a compatible gas 18 (e.g., methane).

A protective layer 16, which may be directly exposed to a compatible gas 18 during operation of the ultrasonic device 10, is provided on the at least one acoustic matching layer 14. In particular, a protective layer 16 may be provided, which has an acoustic impedance equivalent to $Z_{pl}$, where: $0.5 \; ((Z_p)(Z_g)^{N+1})^{1/(N+2)} \leq Z_{pl} \leq 1.5 \; ((Z_p)(Z_g)^{N+1})^{1/(N+2)}$. In some embodiments of the invention, the protective layer 16, which may be provided as a polyethylene terephthalate (PET) layer, may be metalized with a metal such as aluminum and have a thickness of less than about 20 microns, for example. Preferably, a thickness is chosen so that the protective layer 16 inhibits chemical and/or mechanical damage to an underlying acoustic matching layer 14, yet enables sufficient fine-tuning of an acoustic matching frequency within the ultrasonic device 10.

Figure 1B:
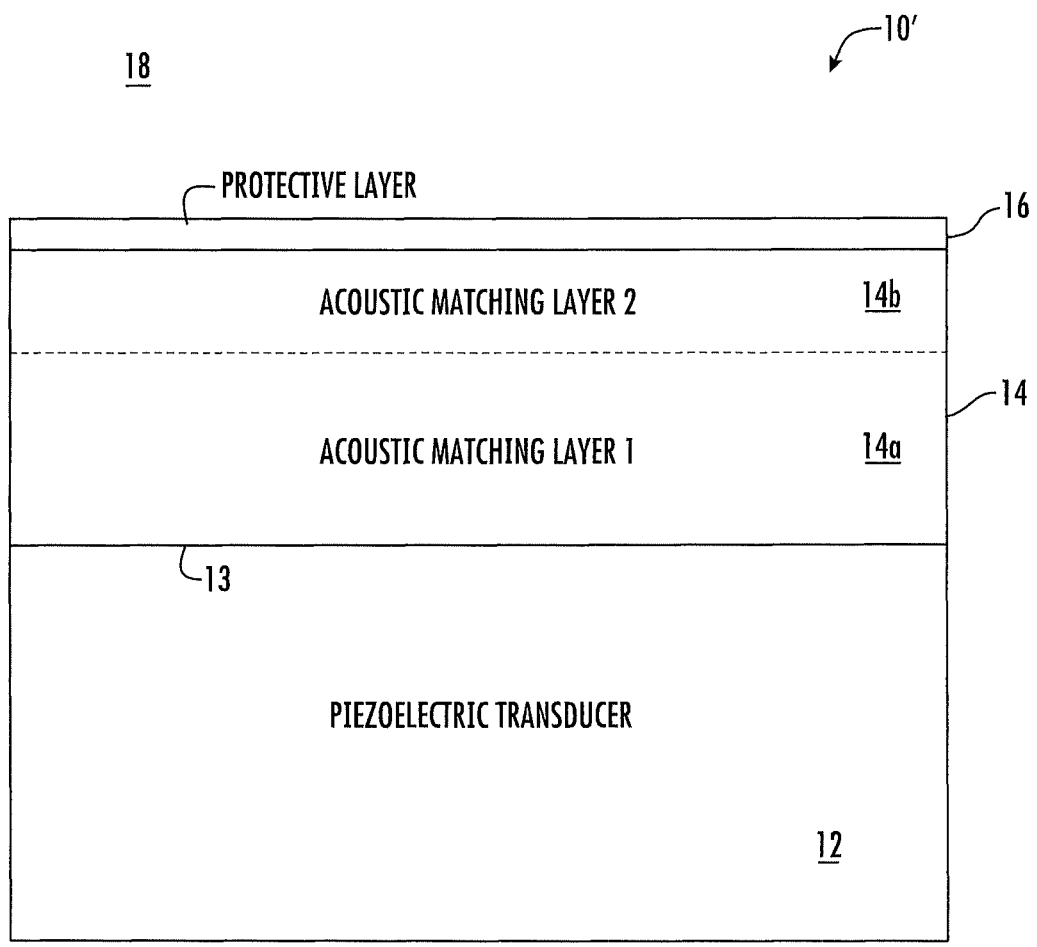

As shown by FIG. 1B, an ultrasonic device 10', which can operate as an ultrasonic sensor or acoustic signal generator, may have two acoustic matching layers (i.e., N=2) and a second of the N acoustic matching layers 14b may extend between the protective layer 16 and the first of the N acoustic matching layers 14a, which may be configured to improve the bandwidth and sensitivity of the ultrasonic device 10'. This second acoustic matching layer 14b may have an acoustic impedance equivalent to $Z_{L2}$, where $Z_{L2}$ is defined as: $0.75 \; ((Z_p)^2(Z_g)^2)^{0.25} \leq Z_{L2} \leq 1.25 \; ((Z_p)^2(Z_g)^2)^{0.25}$. The first acoustic matching layer 14a may be formed as a PET layer and the second acoustic matching layer 14b may be formed as a polyethersulfone (PES) layer, for example. In this manner, the first and second acoustic matching layers 14a, 14b and protective layer 16 may collectively operate as a multi-layered acoustic matching layer (AML) structure.

In some embodiments of the invention, the AML structure may be configured as a PES filter membrane sandwiched between sheets of polymer material (e.g., PET). This filter membrane can operate as a relatively low density, low stiffness and low acoustic impedance material to provide a high degree of acoustic matching, whereas the first acoustic matching layer 14a, with intermediate density, stiffness and acoustic impedance, may improve acoustic bandwidth and transducer sensitivity. Referring again to FIG. 1B, an exemplary matching layer structure for operation at 400 kHz may include a filter membrane acoustic matching layer 14b formed of polyethersulfone, with a pore size of 0.8 microns and thickness of 150 microns. The "front" protective layer 16 may be a less than 20 micron thick polyethylene terephthalate layer (e.g., 10 microns) and the first acoustic matching layer 14a may be a 700 micron thick polyethylene terephthalate layer. The thickness of the protective layer 16 may be sufficient to inhibit chemical and/or mechanical damage to an underlying acoustic matching layer, yet thin enough to enable adequate fine-tuning of an acoustic matching frequency. The protective layer 16 may also be metalized with a metal such as aluminum to provide additional chemical/mechanical protection without significantly reducing frequency tuning capability.

Ultrasonic transducers were created for testing using acoustic matching layers derived from commercially available membrane disk filters, including 150 μm thick polyethersulfone (PES) disk filters with pore size of 0.8 μm and filter disc diameter of 47 mm, as manufactured by Pall Corporation™. A strip of filter membrane material was cut from a circular filter disc and then secured under slight tension (to maintain flatness) to a glass slide. A spray-on adhesive, such as ReMount™, manufactured by the 3M Corporation, was sprayed onto the filter membrane strip for about 0.5 seconds at a distance of 30 cm and at an angle of 45 degrees to vertical. A transducer was placed on the adhesive side of the filter membrane strip and compressed for 60 seconds with a pressure of 0.5 bar. A 250 gram weight was used for a lower frequency transducer having a front face with dimensions of 7×7 mm and a 125 gram weight was used for a higher frequency transducer having a front face with dimensions of 5×5 mm. The filter membrane strip was trimmed with a scalpel to remove material outside the area of the transducer front face (i.e., PZT surface). These cut, adhesive and trimming steps were then repeated to build up additional layers of membrane material, as needed.

During performance testing, transducers were mounted using two pairs of spring probes contacting the sides of an aluminum front plate and stainless steel back plate, to provide mechanical and electrical contact. An acoustic output in response to a 5 Volt (peak-to-peak) sinusoidal input signal with 16-cycle bursts, was measured using an ultrasonic condenser microphone, such as a model CM16/CMPA40-5V microphone manufactured by Avisoft Bioacoustics™. The transmission distance was 15 cm for the low frequency transducers and 8.5 cm for the high frequency transducers. The gain setting on a microphone preamplifier was set to a minimum for low frequency tests and an intermediate value (gain control rotated 180 degrees) for high frequency tests. Transmit-receive performance was measured by selecting a pair of transducers connected by an acrylic tube (inner diameter 18 mm and length 15 cm (for low frequency tests) or length 8.5 cm (for high frequency tests). A digital oscilloscope was used to capture outputs from laser vibrometer, ultrasonic microphone and transducer transmit-receive tests. In the case of the high frequency transducer tests using a 150 micron thick polyethersulfone membrane as an acoustic matching layer, a 20 dB improvement in transmit-receive gain was achieved, relative to an otherwise equivalent transducer with no matching layer.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed:

1. An ultrasonic device, comprising:
   a transducer having a piezoelectric element therein;
   a first acoustic matching layer comprising polyethersulfone (PES), on the piezoelectric element; and
   a polymer protective layer on said first acoustic matching layer.

2. The ultrasonic device of claim 1, wherein said polymer protective layer is a polyethylene terephthalate (PET) layer having a thickness of less than about 20 microns.

3. The ultrasonic device of claim 2, further comprising a second acoustic matching layer comprising PET extending between said first acoustic matching layer and the piezoelectric element.

4. The ultrasonic device of claim 3, wherein said second acoustic matching layer is bonded to the piezoelectric element and said polymer protective layer is bonded to said first acoustic matching layer.

5. The ultrasonic device of claim 4, wherein said polymer protective layer is metalized with aluminum.

6. The ultrasonic device of claim 1, wherein said first acoustic matching layer is bonded to the piezoelectric element and the polymer protective layer is bonded to said first acoustic matching layer.

7. The ultrasonic device of claim 1, wherein the first acoustic matching layer has an acoustic impedance equivalent to $Z_{L1}$, where N is equal to one and $Z_{L1}$ is defined as:

$$0.75((Z_p)^{N+1}(Z_g))^{1/(N+2)} \leq Z_{L1} \leq 1.25((Z_p)^{N+1}(Z_g))^{1/(N+2)},$$

where $Z_p$ is an acoustic impedance of the piezoelectric element and $Z_g$ is an acoustic impedance of a compatible gas.

8. The ultrasonic device of claim 1, further comprising a second acoustic matching layer comprising PET extending between said first acoustic matching layer and the piezoelectric element.

9. The ultrasonic device of claim 8, wherein a density of the second acoustic matching layer is greater than a density of the first acoustic matching layer.

10. The ultrasonic device of claim 8, wherein a stiffness of the second acoustic matching layer is greater than a stiffness of the first acoustic matching layer.

11. The ultrasonic device of claim 8, wherein an acoustic impedance of the second acoustic matching layer is greater than an acoustic impedance of the first acoustic matching layer.

12. The ultrasonic device of claim 1, further comprising a second acoustic matching layer comprising PET extending between said first acoustic matching layer and the piezoelectric element, the first acoustic matching layer having a thickness of about 150 microns and the second acoustic matching layer having a thickness of about 700 microns.

13. The ultrasonic device of claim 2, further comprising a second acoustic matching layer comprising PET extending between said first acoustic matching layer and the piezoelectric element, the first acoustic matching layer having a thickness of about 150 microns and the second acoustic matching layer having a thickness of about 700 microns.

14. The ultrasonic device of claim 1, further comprising a second acoustic matching layer extending between the first acoustic matching layer and the piezoelectric element, wherein the first acoustic matching layer has an acoustic impedance equivalent to $Z_{L2}$, where N is equal to two and $Z_{L2}$ is defined as:

$$0.75((Z_p)^2(Z_g)^2)^{0.25} \leq Z_{L2} \leq 1.25((Z_p)^2(Z_g)^2)^{0.25},$$

where $Z_p$ is an acoustic impedance of the piezoelectric element and $Z_g$ is an acoustic impedance of a compatible gas.

15. The ultrasonic device of claim 1, wherein a resonant frequency of the transducer is about 400 kHz.

16. An ultrasonic sensor comprising:
   the ultrasonic device of claim 1, wherein the piezoelectric element is configured to receive an acoustic signal.

17. An ultrasonic device, comprising:

a transducer having a piezoelectric element therein;

a first acoustic matching layer comprising polyethersulfone (PES), on the piezoelectric element; and a polymer protective layer on said first acoustic matching layer;

the first acoustic matching layer having an acoustic impedance equivalent to $Z_{L1}$, where N is equal to one and $Z_{L1}$ is defined as:

$$0.75((Z_p)^{N+1}(Z_g))^{1/(N+2)} \leq Z_{L1} \leq 1.25((Z_p)^{N+1}(Z_g))^{1/(N+2)},$$

where $Z_p$ is an acoustic impedance of the piezoelectric element and $Z_g$ is an acoustic impedance of a compatible gas.

18. An ultrasonic device, comprising:

a transducer having a piezoelectric element therein;

a first acoustic matching layer comprising polyethersulfone (PES);

a second acoustic matching layer extending between said first acoustic matching layer and the piezoelectric element; and a polymer protective layer on said first acoustic matching layer;

the first acoustic matching layer having an acoustic impedance equivalent to $Z_{L2}$, where N is equal to two and $Z_{L2}$ is defined as:

$$0.75((Z_p)^2(Z_g)^2)^{0.25} \leq Z_{L2} \leq 1.25((Z_p)^2(Z_g)^2)^{0.25},$$

where $Z_p$ is an acoustic impedance of the piezoelectric element and $Z_g$ is an acoustic impedance of a compatible gas.

* * * * *